United States Patent
Bernardoni et al.

(10) Patent No.: US 11,527,881 B2
(45) Date of Patent: Dec. 13, 2022

(54) SMART ELECTRONIC SWITCH

(71) Applicant: Infineon Technologies AG, Neubiberg (DE)

(72) Inventors: Mirko Bernardoni, Villach (AT); Michael Asam, Inchenhofen-Sainbach (DE); Christian Djelassi-Tscheck, Villach (AT); Robert Illing, Finkenstein (AT); Martin Ringswirth, Landskron (AT); Mario Tripolt, Ferndorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/387,253

(22) Filed: Jul. 28, 2021

(65) Prior Publication Data
US 2022/0069560 A1 Mar. 3, 2022

(30) Foreign Application Priority Data
Aug. 28, 2020 (DE) ......................... 102020122571.7

(51) Int. Cl.
 *H02H 3/08* (2006.01)
 *G01R 19/00* (2006.01)
 *G01R 19/165* (2006.01)
(52) U.S. Cl.
 CPC ........... *H02H 3/08* (2013.01); *G01R 19/0038* (2013.01); *G01R 19/16571* (2013.01)
(58) Field of Classification Search
 CPC .... H02H 1/0092; H02H 3/08; G01R 19/0038; G01R 19/16571
(Continued)

(56) References Cited

U.S. PATENT DOCUMENTS

| 5,719,509 A | 2/1998 | Chan |
| 5,862,390 A | 1/1999 | Ranjan |

(Continued)

FOREIGN PATENT DOCUMENTS

| DE | 102004063946 A1 | 3/2006 |
| DE | 102016100498 A1 | 7/2016 |

(Continued)

OTHER PUBLICATIONS

Infineon Technologies AG, "BTN8962TA High Current PN Half Bridge NovalithIC™," Data Sheet, Rev 1.0, May 17, 2013, 26 pp.
(Continued)

*Primary Examiner* — Kevin J Comber
(74) *Attorney, Agent, or Firm* — Shumaker & Sieffert, P.A.

(57) ABSTRACT

A circuit includes a monitor circuit. The monitor circuit includes a nonlinear functional unit configured to receive a current sense signal and to generate a power signal representing the power of the current sense signal. The circuit further includes a first filter configured to receive the power signal and to generate a first filtered signal and a second filter configured to receive an input signal that depends on the current sense signal and to generate a second filtered signal. A comparator circuit is configured to receive the first filtered signal and the second filtered signal and to compare the first filtered signal with a first threshold value and the second filtered signal with a second threshold value. The protection signal is indicative of whether the first filtered signal exceeds the first threshold value or the second filtered signal exceeds the second threshold value.

16 Claims, 8 Drawing Sheets

(58) Field of Classification Search
USPC .............................................................. 361/1
See application file for complete search history.

(56) References Cited

U.S. PATENT DOCUMENTS

| | | | |
|---|---|---|---|
| 5,877,647 A | 3/1999 | Vajapey et al. |
| 6,144,085 A | 11/2000 | Barker |
| 6,924,669 B2 | 8/2005 | Itoh et al. |
| 7,279,765 B2 | 10/2007 | Ahn et al. |
| 7,489,855 B2 | 2/2009 | Kraus |
| 8,018,245 B2 | 9/2011 | Sohn |
| 9,293,907 B2 | 3/2016 | Ueta et al. |
| 9,413,352 B2 | 8/2016 | Lim |
| 9,672,201 B1 | 6/2017 | Uszkoreit et al. |
| 9,705,394 B2 | 7/2017 | Ohshima |
| 9,887,532 B2 | 2/2018 | Djelassi et al. |
| 9,954,548 B2 | 4/2018 | Illing et al. |
| 10,170,905 B2 | 1/2019 | Illing et al. |
| 10,305,363 B1 | 5/2019 | Chen et al. |
| 10,868,418 B2 | 12/2020 | Djelassi-Tscheck et al. |
| 11,018,664 B2 | 5/2021 | Bernardoni et al. |
| 11,404,866 B2 | 8/2022 | Illing et al. |
| 2002/0024376 A1 | 2/2002 | Sander |
| 2005/0184715 A1 | 8/2005 | Kidokoro et al. |
| 2005/0270869 A1 | 12/2005 | Krischke et al. |
| 2006/0023383 A1 | 2/2006 | Thiery et al. |
| 2007/0008744 A1 | 1/2007 | Heo et al. |
| 2012/0194119 A1 | 8/2012 | Kroeze et al. |
| 2013/0301175 A1 | 11/2013 | Posat |
| 2014/0078629 A1 | 3/2014 | Cortigiani et al. |
| 2014/0091384 A1 | 4/2014 | Petruzzi et al. |
| 2017/0063077 A1 | 3/2017 | Donath et al. |
| 2017/0294772 A1 | 10/2017 | Illing et al. |
| 2017/0294918 A1 | 10/2017 | Illing et al. |
| 2017/0294922 A1* | 10/2017 | Illing ..................... H02H 3/093 |
| 2017/0366116 A1 | 12/2017 | Ogawa et al. |
| 2018/0287365 A1 | 10/2018 | Djelassi-Tscheck et al. |
| 2019/0052074 A1* | 2/2019 | Asam .................... G01R 31/382 |
| 2020/0021207 A1 | 1/2020 | Donat et al. |
| 2021/0028615 A1 | 1/2021 | Mayer et al. |
| 2021/0028780 A1 | 1/2021 | Mayer et al. |
| 2021/0028781 A1* | 1/2021 | Mayer ................. H03K 17/0828 |
| 2021/0050718 A1 | 2/2021 | Djelassi-Tscheck et al. |
| 2021/0050848 A1 | 2/2021 | Bernardoni et al. |
| 2021/0050850 A1 | 2/2021 | Djelassi-Tscheck et al. |

FOREIGN PATENT DOCUMENTS

| | | |
|---|---|---|
| DE | 102015114460 A1 | 3/2017 |
| DE | 102017107521 A1 | 10/2017 |
| DE | 102017107520 A1 | 11/2017 |
| DE | 102017107523 A1 | 11/2017 |
| DE | 102017106896 A1 | 10/2018 |
| WO | 01/69784 A1 | 9/2001 |

OTHER PUBLICATIONS

International Standard ISO 26262-1, Second Edition, Dec. 2018, entitled "Road vehicles-Functional safety—Part 1: Vocabulary," 42 pp.

International Standard ISO 7637-2, Third Edition, Mar. 1, 2011, entitled "Road vehicles—Electrical disturbances from conduction and coupling—Part 2: Electrical transient conduction along supply lines only," 48 pp.

Jain et al., "Analysis and Design of Digital IIR Integrators and Differentiators Using Minimax and Pole, Zero, and Constant Optimization Methods," accepted May 2013, 15 pp.

Oppeheim et al., "Discrete-Time Signal Processing," Sec. 6.3, Second Edition, ISBN 0-13-754920.2, 1999, 5 pp. (Applicant points out, in accordance with MPEP 609.04(a), that the year of publication, 1999, is sufficiently earlier than the effective U.S. filing date, so that the particular month of publication is not in issue.).

Office Action from counterpart German Application No. 102020122571.7 dated Aug. 10, 2022, 8 pp.

* cited by examiner

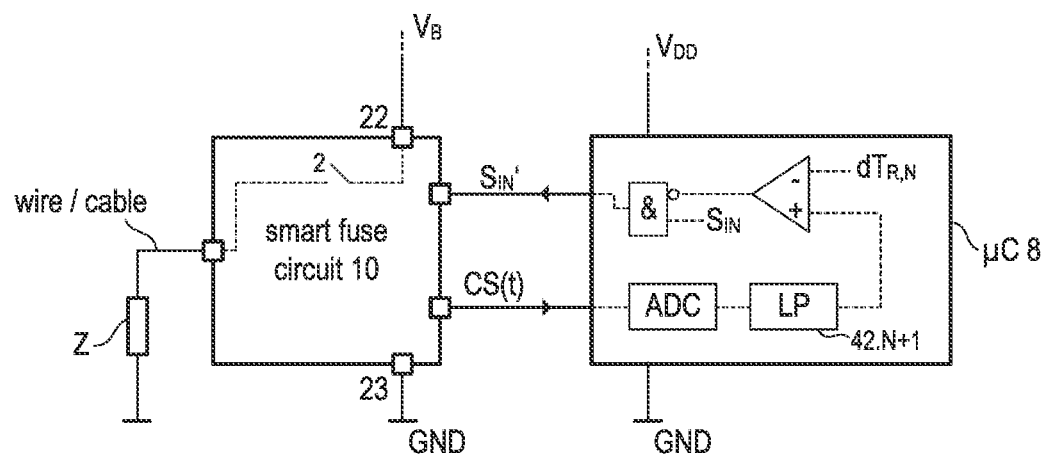
Fig. 14     (filter 42.N+1 implemented in µC)

SMART ELECTRONIC SWITCH

This Application claims priority to German Patent Application Number 102020122571.7, filed Aug. 28, 2020, the entire content of which is incorporated herein by reference.

TECHNICAL FIELD

The present disclosure relates to the field of smart semiconductor switches.

BACKGROUND

Almost every electric installation (e.g. in an automobile, in a house, electric subsystems of larger installations) includes one or more fuses to provide over-current protection. Standard fuses include a piece of wire that provides a low-ohmic current path in case the current passing through the fuse is below a nominal current. However, the piece of wire is designed to heat up and melt or vaporize when the current passing through the fuse exceeds the nominal current for a specific time. Once triggered, a fuse must be replaced by a new one.

Fuses are being increasingly replaced by circuit breakers. A circuit breaker is an automatically operated electrical switch designed to protect an electrical circuit from damage caused by overcurrent, overload or short-circuit. Circuit breakers may include electro-mechanical relays which are triggered to disconnect the protected circuit from the supply when an over-current (i.e. a current exceeding the nominal current) is detected. In many applications (e.g. in the on-board power supply of an automobile), circuit breakers may be implemented using an electronic switch (e.g. a MOS transistor, an IGBT or the like) to disconnect the protected circuit from the supply in case of an over-current. Such electronic circuit breakers may also be referred to as electronic fuses (e-fuses or smart fuses). Besides its function as a circuit breaker, an electronic fuse may also be used to regularly switch a load on and off. Usually the switching state (on/off) of electronic switches such as MOS transistors is controlled using so-called driver circuits or simply drivers (gate drivers in case of MOS transistors).

Usually, conventional fuses—and electronic fuses—are designed for a (hypothetical) constant electric load that produces a specific thermal load on the cable. That is, the constant electric load results in a specific cable temperature above ambient temperature. The purpose of the fuse is to ensure that the thermal load on the cable stays within a defined limit. Therefore, known electronic fuse circuits are designed to emulate the time-current characteristic of a cable that supplies the load (which defines for how long a specific current level may flow through the electronic fuse before the fuse triggers the disconnection of the load). However, in many applications the load changes dynamically. In view of the fact that the thermal time constant of commonly used cables is in the range of a few minutes (e.g. 90 seconds in some applications) the activation of an electric load for, e.g., 30 seconds, may be a highly dynamic process as compared to the thermal time constant of the cable.

SUMMARY

An circuit that can be employed in a smart switch is described herein. In accordance with one embodiment the circuit includes a monitor circuit that is configured to receive a current sense signal and to provide a protection signal. The monitor circuit includes a nonlinear functional unit configured to receive the current sense signal and to generate a power signal representing the power of the current sense signal. The circuit further includes a first filter configured to receive the power signal and to generate a first filtered signal and a second filter configured to receive an input signal that depends on the current sense signal and to generate a second filtered signal. A comparator circuit is configured to receive the first filtered signal and the second filtered signal and to compare the first filtered signal with a first threshold value and the second filtered signal with a second threshold value. The protection signal is indicative of whether the first filtered signal exceeds the first threshold value or the second filtered signal exceeds the second threshold value.

Furthermore, a method that may be used in a smart switch is described. In accordance with one embodiment the method includes providing a signal representing a load current passing through a power transistor and generating a protection signal based on the current sense signal. Therein, generating the protection signal includes generating a power signal representing the power of the current sense signal by applying a nonlinear function to the current sense signal; filtering the power signal to generate a first filtered signal and generating a second filtered signal based on the current sense signal; and comparing the first filtered signal with a first threshold value and the second filtered signal with a second threshold value. The protection signal is indicative of whether the first filtered signal exceeds the first threshold value or the second filtered signal exceeds the second threshold value.

BRIEF DESCRIPTION OF THE DRAWINGS

The embodiments described below can be better understood with reference to the following drawings and descriptions. The components in the figures are not necessarily to scale; instead emphasis is placed upon illustrating the principles of the invention. Moreover, in the figures, like reference numerals designate corresponding parts. In the drawings:

FIG. 14 illustrates another embodiment in which part of the monitoring circuit is implemented in an external circuitry such as a microcontroller.

DETAILED DESCRIPTION

In the following detailed description, reference is made to the accompanying drawings. The drawings form part of the description and, for the purpose of illustration, show examples of how the invention can be used and implemented. It is to be understood that the features of the various embodiments described herein may be combined with each other, unless specifically noted otherwise. Further, although the examples described herein are directed to electronic fuse circuit, the embodiments are not limited to applications related to electronic fuses.

Figure 1:
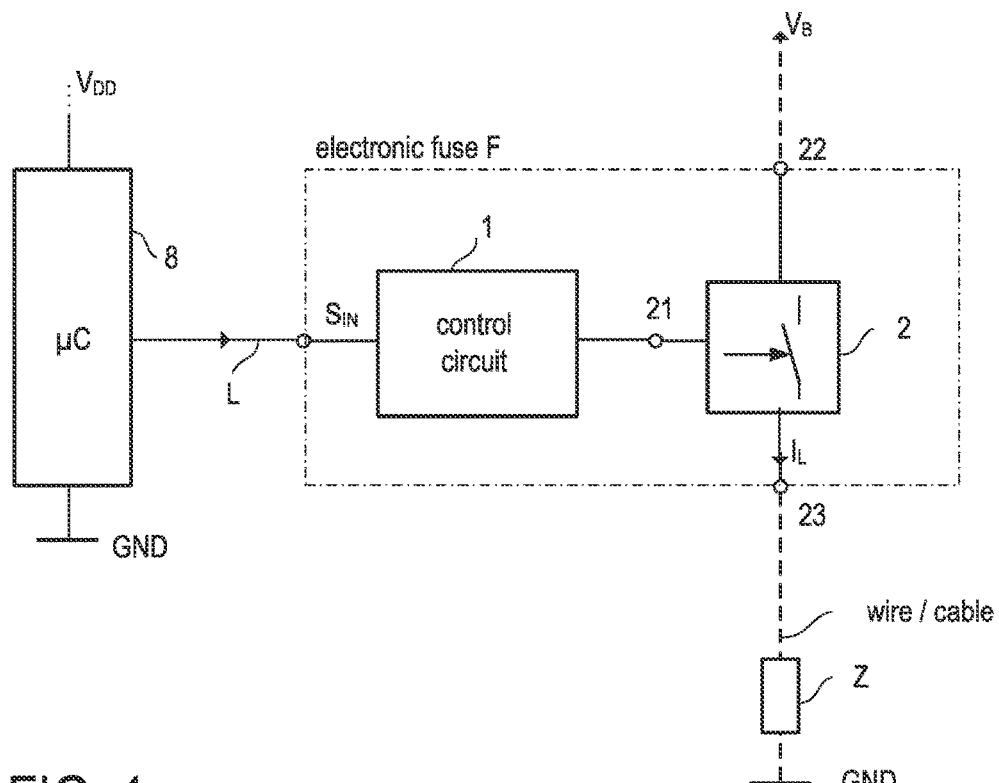
FIG. 1 schematically illustrates one example of an electronic fuse circuit including an electronic switch and a control circuit configured to drive the electronic switch and an exemplary application of the electronic fuse circuit.

FIG. 1 illustrates one example of an electronic circuit that can be operated as an electronic fuse. Therefore, the electronic circuit is further referred to as electronic fuse circuit F. In accordance with the present example, an electronic fuse circuit includes an electronic switch 2 with a control node 21 and a load current path between a first load node 22 and a second load node 23. The electronic circuit further includes a control circuit 1 coupled to the control node 21 of the electronic switch 2 and configured to drive the electronic switch 2. The electronic fuse circuit F with electronic switch 2 and control circuit 1 may be monolithically integrated in one semiconductor die (chip) or may be integrated in two semiconductor dies that are arranged in one integrated circuit package. Alternatively, gate driver and MOSFET may be integrated in separate chips. The electronic fuse circuit F is configured to drive a load Z (the wires connecting the load are illustrated in dashed lines in FIG. 1), which can be connected in series with the load current path of the electronic switch 2. Thus the series circuit of the load current path of the electronic switch 2 and load Z can be connected between supply nodes, at which a first supply potential and a second supply potential can be provided. The second supply potential is usually referred to as ground potential GND (e.g. zero volts). In the following, a voltage between the two supply nodes is referred to as supply voltage VB. The load current $i_L$ passing through the load Z can be switched on and off in accordance with an input signal $S_{IN}$ supplied to the control circuit 1, for example, by a micro controller 8. However, dependent on the application, the input signal $S_{IN}$ can also be generated by any other circuitry instead of a micro controller.

In an exemplary application, the electronic fuse circuit F may be used to drive a load Z in an automobile. In this case, the power source that supplies the supply voltage $V_B$ is an automobile battery. Generally, "to drive a load" may include switching on or off the load current passing through the load by switching on or off the electronic switch 2. The load may be an arbitrary load used in an automobile. Examples of the load Z include, inter alia, different types of lamps, different types of motors, relays, a heating system, or the like. The load Z may also represent an electric subsystem (including a plurality of individual electric loads) of the electric installation of an automobile. In the example of FIG. 1, the electronic switch 2 and the load Z are connected in a high-side configuration. That is, the load Z is connected between the electronic switch 2 and the ground node GND. This, however, is only an example. The electronic switch 2 and the load Z can also be connected in a low-side configuration or in any other configuration as well. For example, in a low-side configuration the electronic switch is connected between the load Z and the ground node GND.

According to the example of FIG. 1, the load Z may be connected to the electronic switch 2 via an electrically conductive wire (e.g. included in a cable). Dependent on where the electronic circuit and the respective load Z are located in the electric installation of an automobile, the wire may have a considerable length of several 10 cm or even significantly more (e.g. up to 10 m). A modern automobile includes a plurality of electric loads, so that a plurality of wires are required to connect the individual loads to their respective electronic switches. In order to save costs and resources, it may be desirable to dimension the individual wires such that, in the long term, they withstand a nominal current of the connected load. If, however, the current rises above the nominal current, the wire may be damaged or even destroyed due to overheating. According to one exemplary embodiment, the control circuit 1 may therefore have a current monitor function in order to monitor the load current $i_L$ passing through the electronic switch 2 (and the load Z). The current monitoring allows to switch off the electronic switch 2 in order to protect the wire (and the load Z) when an "overload situation" is detected. An overload situation is a situation that may result in the wire or the load being damaged or destroyed if the electronic switch 2 is not switched off (within a specific time) to disconnect the wire (and the load Z) from the power source that provides the supply voltage $V_B$ (e.g. the automobile battery). This mechanism is explained in further detail below. As the electronic fuse circuit F is configured to switch on and off the load Z and to protect the wire, it is also referred to as switching and protection circuit in the following.

In the example of FIG. 1, the electronic switch 2 is schematically drawn as a circuit block that includes a switch. In the following, the term "electronic switch" includes any type of electronic switch or electronic circuitry that has a control node 21 and a load current path between the first load node 22 and the second load node 23 and that is configured to be switched on and off dependent on a drive signal received at the control node 21. "Switched on" means that the electronic switch 2 operates in an on-state in which the electronic switch 2 is capable of conducting a current between the first load node 22 and the second load node 23. "Switched off" means that the electronic switch 2 is operated in an off-state in which the electronic switch 2 is capable of preventing a current flow between the first load node 22 and the second load node 23. According to one example, the electronic switch 2 includes at least one transistor. The at least one transistor may be, for example, a MOSFET (Metal Oxide Semiconductor Field-Effect Transistor), an IGBT (Insulated Gate Bipolar Transistor), a JFET (Junction Field- Effect Transistor), a BJT (Bipolar Junction Transistor), or a HEMT (High Electron Mobility Transistor).

In the following, examples of the control circuit 1 and its function are explained with reference to drawings. In particular, the function of the control circuit 1 is explained with reference to functional blocks depicted in the drawings. It should be noted that these functional blocks represent the function of the control circuit 1 rather than its specific implementation. These functional blocks may be dedicated circuit blocks configured to perform the respective function explained below. However, it may also be possible for the functions of the individual functional blocks to be (at least in part) performed by a programmable circuit (e.g. a processor) that is configured to execute software/firmware stored in a memory.

Figure 2:
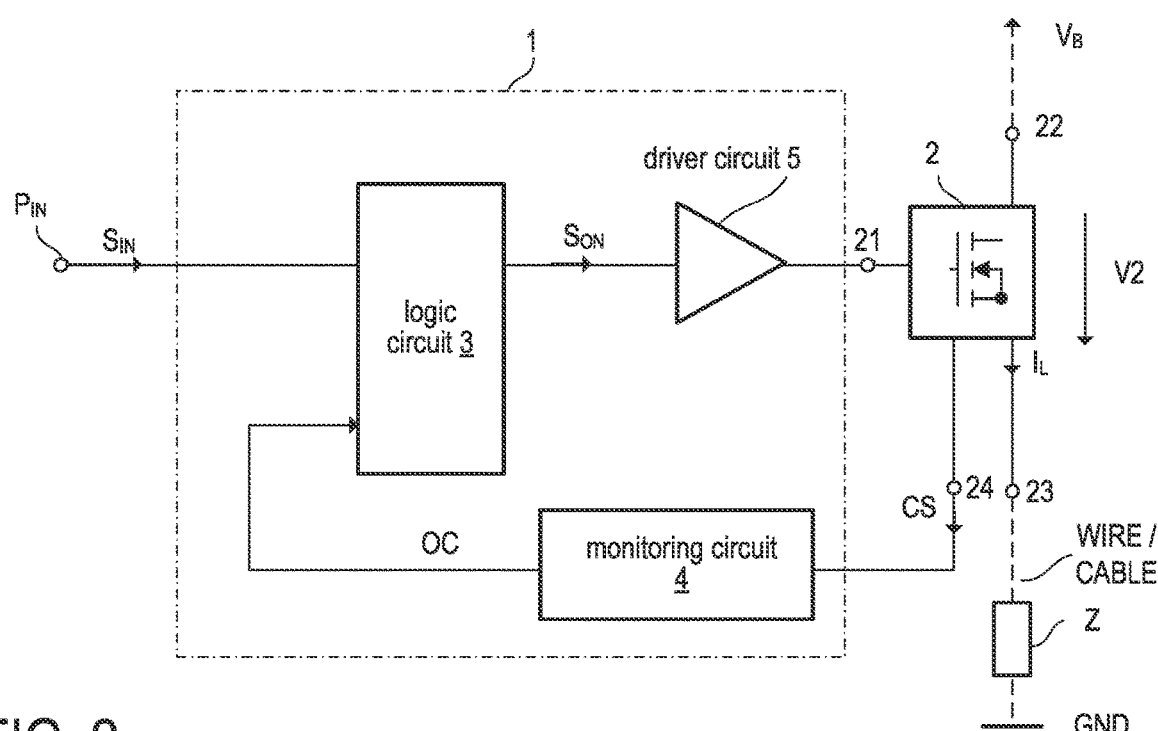
FIG. 2 illustrates one example of the control circuit of FIG. 1 in more detail.

FIG. 2 illustrates one exemplary implementation of the control circuit 1. In this example, the control circuit 1 includes a monitoring circuit 4 that is configured to generate a first protection signal OC based on a time-current characteristic of the load current $i_L$. The expression "to generate the first protection signal OC based on the time-current characteristic of the load current" may include that the monitoring circuit 4 processes a signal representing the instantaneous current amplitude of the load current $i_L$ as well as previous current amplitudes to generate the first protection signal OC. That is, the monitoring circuit 4 evaluates a load current $i_L$ over a certain time period in order to generate the first protection signal OC. In order to be able to evaluate the load current $i_L$, the monitoring circuit 4 receives a current sense signal CS and generates the first protection signal OC based on the current sense signal CS. The current sense signal CS represents the load current $i_L$ and, according to one example, may be proportional to the load current $i_L$. In the example of FIG. 2, the current sense signal CS is available at a sense output 24 of the electronic switch 2. In this case, a current measurement circuit configured to measure the load current $i_L$ and provide the current sense signal CS may be (at least partially) integrated in the electronic switch 2. However, this is only an example. A current measurement circuit separate from the electronic switch 2 may be used as well. Various current sense circuits (e.g. shunt resistors, Sense-FET circuits, etc.) are known and are thus not further explained herein in detail.

The control circuit 1 illustrated in FIG. 2 is configured to drive the electronic switch 2 based on the protection signal OC and an input signal $S_{IN}$ received at a first input node (e.g. input pin) $P_{IN}$ of the electronic fuse circuit F. The protection signal OC, as well as the input signal $S_{IN}$, are supplied to a logic circuit 3, which generates a drive signal $S_{ON}$ based on the protection signal OC and the input signal $S_{IN}$. The drive signal $S_{ON}$ is directly or indirectly (e.g. via diver circuit 5) supplied to the control node 21 of the electronic switch 2 in order to switch the electronic switch 2 on or off. According to one example, the drive signal $S_{ON}$ may be a logic signal that has an on-level indicating that it is desired to switch the electronic switch 2 on or an off-level indicating that it is desired to switch the electronic switch 2 off. The driver circuit 5 (or simply driver) is configured to drive the electronic switch 2 based on the respective signal level of the drive signal $S_{ON}$. The electronic switch 2, for example, includes a transistor such as a MOSFET (as schematically illustrated in FIG. 2). A MOSFET is a voltage-controlled semiconductor device that switches on or off dependent on a drive voltage applied between a gate node and a source node. In this example, the driver 5 is configured to generate the drive voltage (gate voltage $V_G$) based on the drive signal $S_{ON}$ in order to switch on or off the MOSFET in accordance with the drive signal. When using MOSFETs, the driver 5 is also referred to as gate driver.

Figure 3:
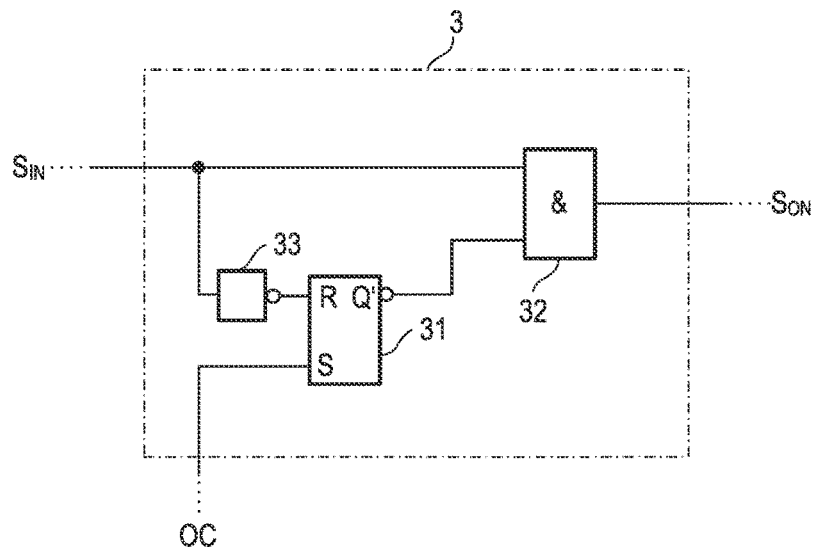
FIG. 3 illustrates one example of a logic circuit used in the control circuit of FIG. 2.

The circuit of FIG. 3 illustrates one exemplary implementation of (a part of) the logic circuit 3. In the present example, the logic circuit 3 includes an inverter 33, an SR latch 31 (flip-flop) and an AND gate 32. A first input of the AND gate 32 is configured to receive the input signal $S_{IN}$, whereas a reset input R of the SR latch 31 is configured to receive the inverted input signal provided by inverter 33. The set input S of the SR latch 31 is configured to receive the protection signal OC. The inverting output Q' of the SR latch 31 is connected with a second input of the AND gate 32. The drive signal $S_{ON}$ is provided at the output of the AND gate 32.

Figure 4:
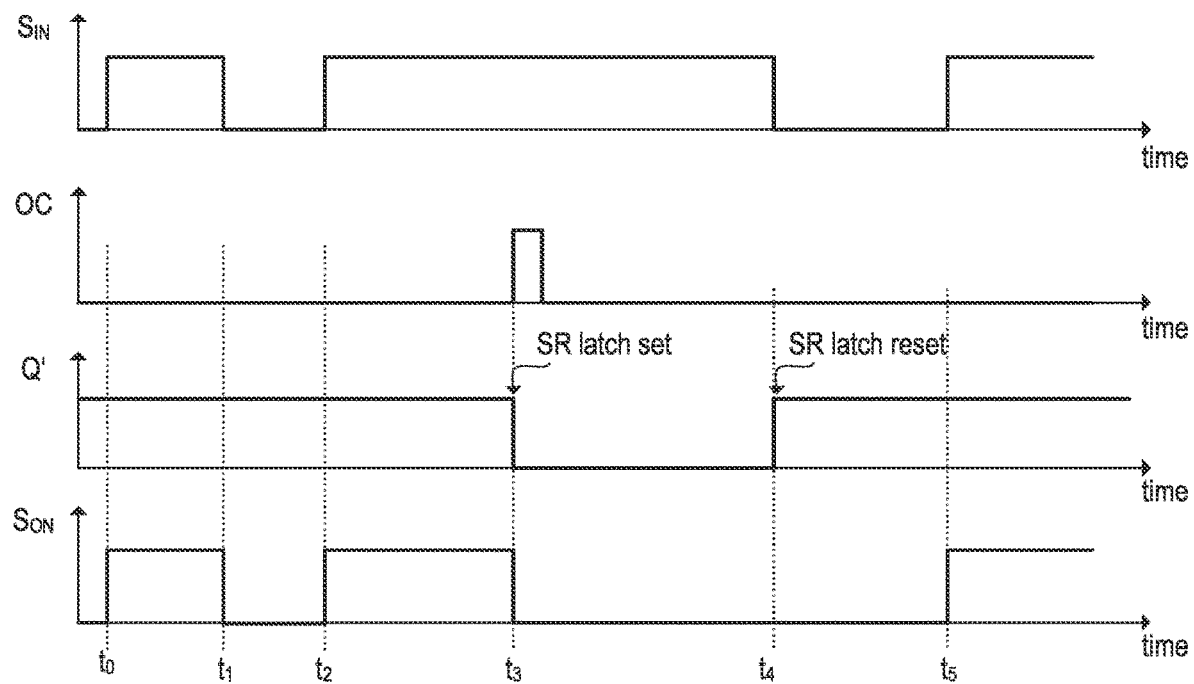
FIG. 4 shows timing diagrams illustrating the function of the control circuit shown in FIG. 2.

The function of the logic circuit 3 is further illustrated in the timing diagrams of FIG. 4. The initial low level of input signal $S_{IN}$ causes a reset of the SR latch 31, which results in a high level at the inverting output Q' of the SR latch 31. Accordingly, both inputs of the AND gate 32 "see" a high level, and the output of the AND gate 32 provides the drive signal $S_{ON}$ with a high-level. When the input signal $S_{IN}$ changes to a low level (indicating a switch-off of the electronic switch 2, see FIG. 4, time instant $t_1$ and $t_2$), the AND gate 32 "sees" a low level at its first input and the output of the AND gate 32 provides the drive signal $S_{ON}$ with a low-level (which causes a switch off of the power transistor 2). In other words, the input signal $S_{IN}$ is fed through the logic circuit 3 (i.e. the drive signal $S_{ON}$ equals the input signal $S_{IN}$) provided that the SR latch 31 is in its reset state. Once the SR latch 31 is set in response to the protection signal OC changing to a high-level, the inverting output Q' of the SR latch 31 is set to a low level (see FIG. 4, time instant $t_3$). Accordingly, the AND gate 32 sees a low level at its second input and the drive signal $S_{ON}$ is set to a low level. In other words, the input signal $S_{IN}$ is blanked by the AND gate 32. The drive signal $S_{ON}$ remains at a low-level until the input signal $S_{IN}$ is set to a low level (indicating a switch-off of the electronic switch 2 and a reset of SR latch 31, see FIG. 4, time instant $t_4$) and again to a high level (indicating a switch-on of the electronic switch 2, see FIG. 4, time instant $t_5$). It is again noted that the function of the exemplary implementation of FIG. 3 may be implemented in various other ways as well. Further, it is noted that in other embodiments the reset of the SR latch 31 may be triggered in a different way. For example, the microcontroller 8 (see FIG. 1) may provide a dedicated reset signal.

Figure 5A:
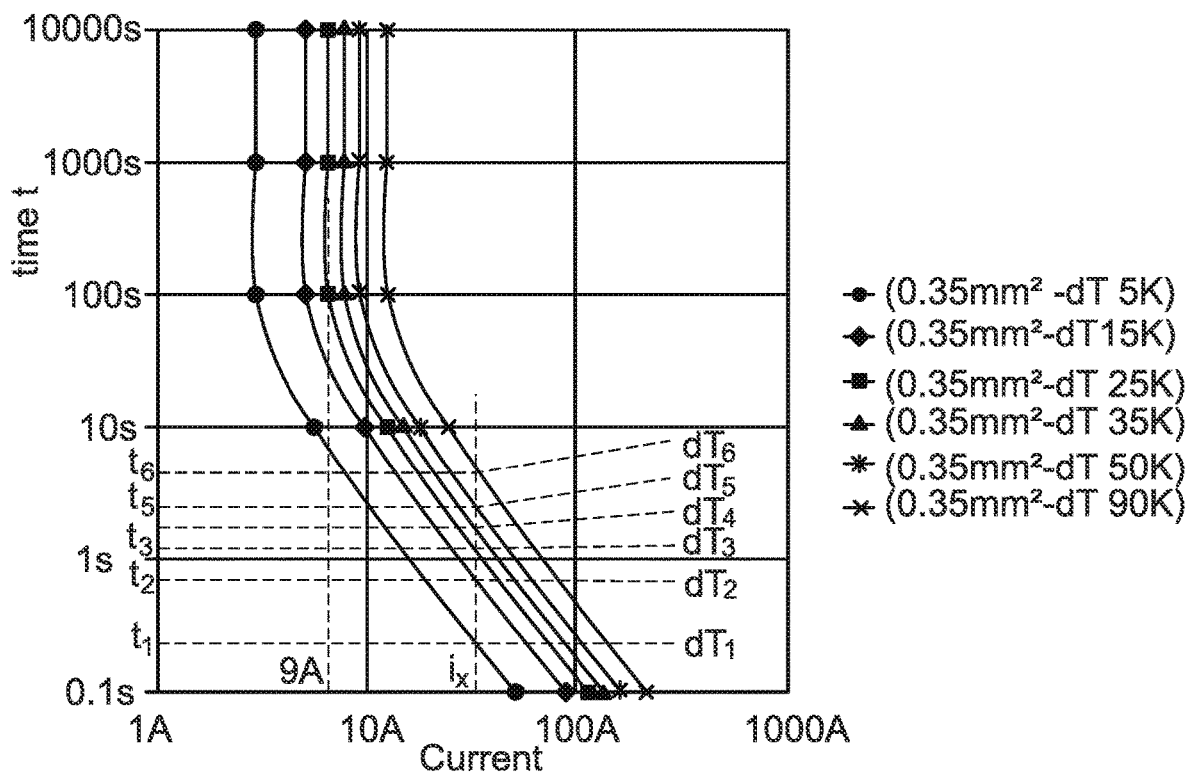
FIG. 5a is a diagram illustrating a family of characteristic curves (time over current) for a 0.35 mm$^2$ cable and for different maximum cable temperatures.
Figure 5B:
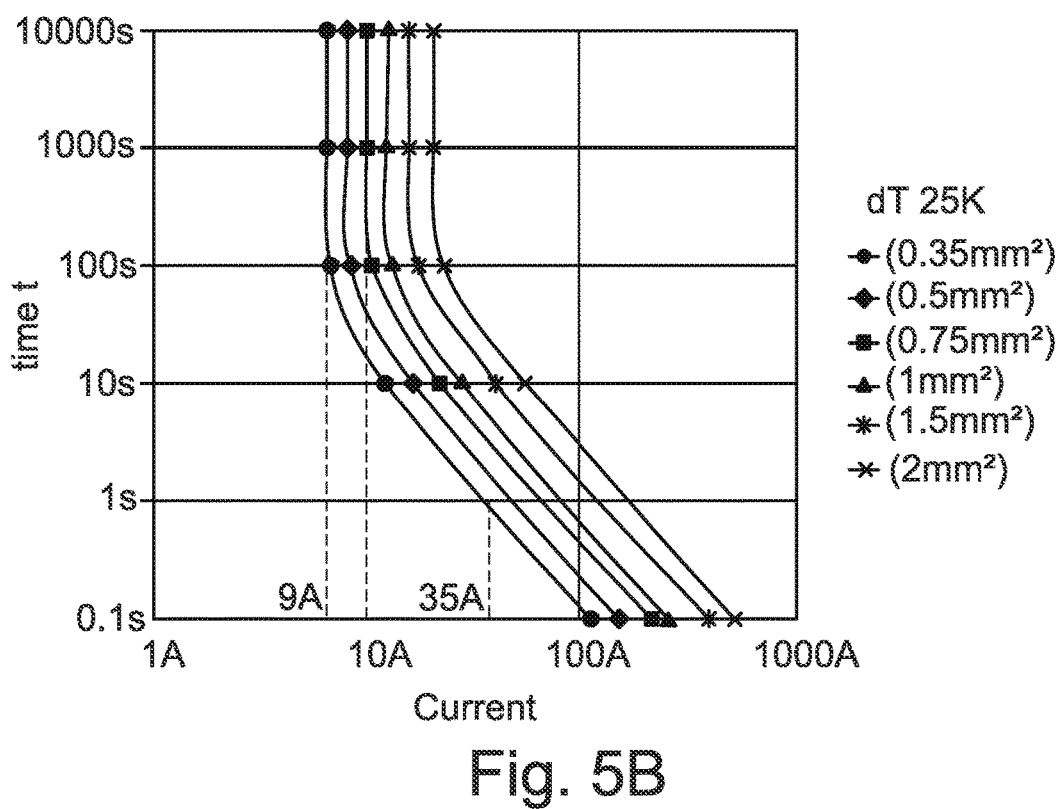
FIG. 5b is a diagram illustrating a family of characteristic curves (time over current) for a maximum cable temperature of 25 Kelvin above ambient temperature and for different cable cross-sections.

As mentioned above, the wire connecting load Z and electronic fuse circuit F can be designed to withstand a nominal current of the load Z. The lifetime of a wire (or a cable) depends on the wire temperature. FIGS. 5A and 5B are diagrams showing a family of characteristic curves (each representing a specific time-current characteristics), wherein each characteristic curve is associated with a specific combination of maximum temperature difference dT (maximum temperature above ambient temperature) and cable cross section (e.g. cross-sectional area in mm$^2$). Each characteristic curve can be regarded as an "isotherm" (line of equal temperature dT) and represents the relation between the current and the maximum allowable time period that the wire can carry the current without exceeding the specified temperature difference dT.

FIG. 5A shows characteristic curves for various temperature differences dT and a specific cross sectional area of 0.35 mm$^2$, while FIG. 5B shows characteristic curves for a specific temperature difference dT of 25 K (Kelvin) and various cross sectional areas. As can be seen from FIGS. 5A and 5B, a wire with a cross-sectional area of 0.35 mm$^2$ can carry a current of approximately 9 A (amperes) for a practically infinite amount of time without exceeding a temperature difference dT of 25 K above ambient temperature. As can be seen from FIG. 5B, a wire with a cross-sectional area of 0.75 mm² can carry a current of 10 A (amperes) for approximately 100 seconds or 35 A for approximately 1 second before exceeding a temperature difference dT of 25 K above ambient temperature. Generally the higher the current, the shorter the allowable time period for a given cross-sectional area and a given temperature difference. It is noted that the characteristic curves shown in the diagrams of FIGS. 5A and 5B have a linearly falling branch in a double logarithmic representation.

Figure 6:
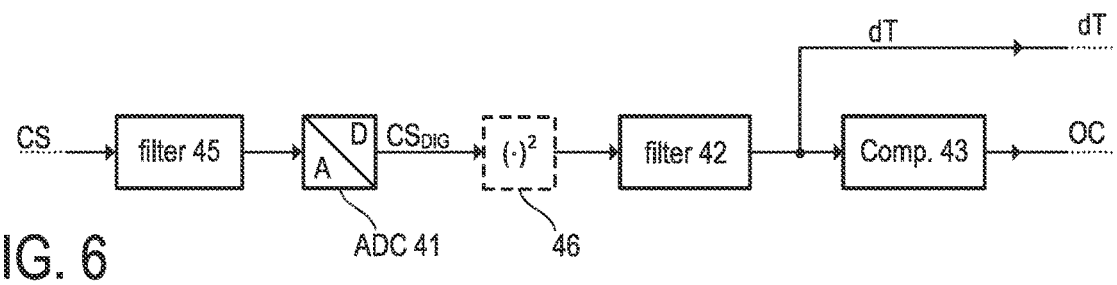
FIG. 6 illustrates one example of the monitoring circuit used in the example of FIG. 2; the monitoring circuit includes a filter and a comparator, wherein the filter time constant and the comparator threshold determine the time-current-characteristic of the monitoring circuit.

As can be seen from FIGS. 5A and 5B, a temperature difference $dT_x$ (e.g. temperature values $dT_1$, $dT_2$, $dT_3$, $dT_4$, $dT_5$, $dT_6$) is associated with a given integration time $t_x$ (e.g. times $t_1$, $t_2$, $t_3$, $t_4$, $t_5$, $t_6$) for a given current (see FIG. 5A, current $i_x$) and a specific cross-sectional area (e.g. 0.35 mm² in the example of FIG. 5A). Hence, a temperature value dT (representing the temperature above ambient temperature) can be determined for a specific wire cross section by integrating the power resulting from a load current $i_L=i_x$ passing through the wire over time. The first protection signal OC may indicate a switch-off of the electronic switch 2 when the temperature value dT reaches a defined first reference temperature difference $dT_R$. The mentioned integration can be efficiently implemented using a digital filter, which may be included in the monitoring circuit 4 (see FIG. 2). One exemplary implementation of a monitoring circuit is illustrated in FIG. 6. In the embodiments described herein, the digital filter is a low-pass filter. In one embodiment, the low-pass filter is a first order filter, which is sufficient when using a simple thermal model of the cable (based on Fourier's law).

Basically, the monitoring circuit of FIG. 6 is configured to determine the first protection signal OC based on the current sense signal CS. As mentioned, the integration can be carried out in a digital filter 42, which has an integrating characteristic (implemented by a low-pass filter). According to the depicted example, the current sense signal CS, which may be a voltage that is proportional to the load current $i_L$, is supplied to the input of filter 45, which may be an (optional) analog low-pass filter, to remove transients or the like that have a comparably high frequency. The output of filter 45 may be connected to the input of analog-to-digital converter (ADC) 41, which is configured to digitize the filtered current sense signal CS. The ADC 41 may have a logarithmic characteristic in order to account for the logarithmic characteristic curves shown in FIGS. 5A and 5B. The (e.g. logarithmized) digital current sense signal $CS_{DIG}$ is then "transformed" to a temperature value dT by digital filter 42. The resulting temperature value dT (representing a temperature difference above ambient temperature) is then supplied to digital comparator 43, which can be configured to set the first protection signal OC to a high-level when the temperature value dT provided at the output of digital filter 42 exceeds the first reference temperature difference $dT_R$ (e.g. 25 K) specified for a specific wire cross-section.

The squaring unit 46 depicted in FIG. 6 can be omitted, dependent on the characteristic of the ADC 41. However, if the ADC 41 has a "normal" (i.e. linear) characteristic, the squaring is needed to obtain a value indicative of the power. In other embodiments, the squaring unit 46, if omitted, should be replaced by other suitable non-linear functions. In essence, the input signal supplied to filter 42 is representative of the power resulting from the load current $i_L$.

As mentioned, the digital filter 42 is configured to convert the (e.g. squared) load current and an associated integration time, during which the current passes through the wire, into a temperature value dT. In the present example, the filter characteristic 42 depends on a parameter characterizing the wire, e.g. the cross-sectional area of the wire that carries the current, and may be represented by a family of characteristic curves such as those shown in the diagram of FIG. 5A (for an exemplary cross-sectional area of 0.35 mm²).

Figure 7:
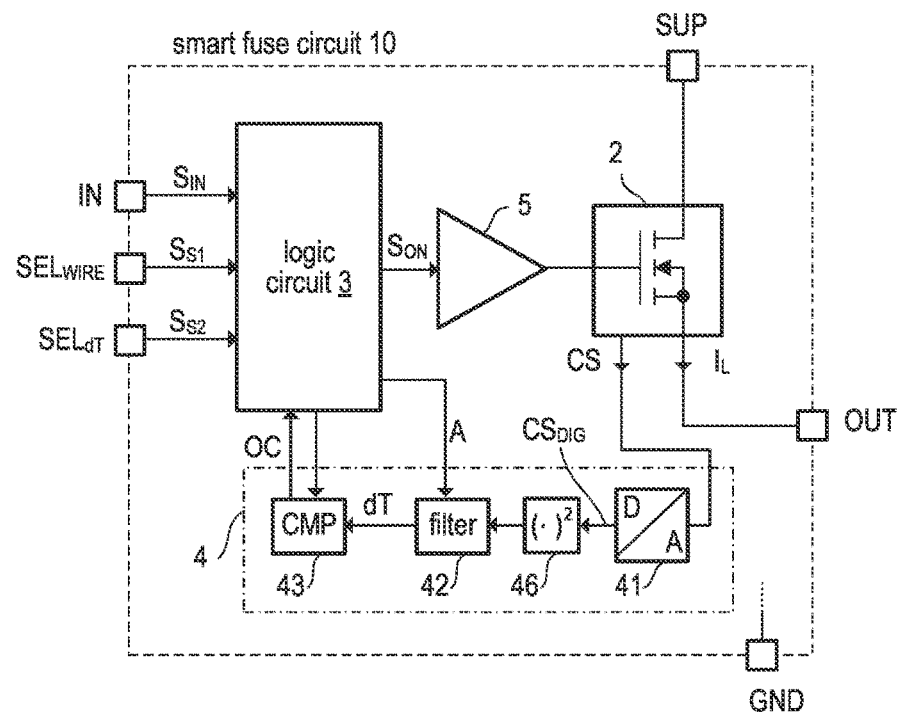
FIG. 7 illustrates a first example of an e-fuse ("smart fuse") circuit that allows selection of wire cross section and maximum cable temperature.

FIG. 7 illustrates one example of an electronic fuse circuit, which is further referred to as smart fuse circuit 10. The circuit of FIG. 7 is substantially the same as the circuit of FIG. 2 and reference is made to the respective description. However, the logic circuit 3 is more sophisticated than in the example of FIG. 2 and the monitoring circuit 4 is implemented in accordance with FIG. 6, wherein the analog low-pass filter 45 has been omitted (the low-pass filter 45 is optional). However, different from the example in FIG. 6, the monitoring circuit 4 is configurable in the present example such that its characteristic can be selected based on at least one wire parameter, which allows, for example, to select a characteristic for a specific wire cross section and/or a desired reference temperature difference $dT_R$ (temperature threshold). In the examples described herein, the at least one wire parameter represents the cable cross-sectional area and/or the maximum temperature value above ambient temperate. As can be seen in the diagrams of FIGS. 5A and 5B, these two wire parameters define a specific characteristic curve that represents the desired behavior of the electronic fuse circuit for a specific wire/cable. It is understood that other parameters such as wire diameter or absolute temperature (e.g. in case ambient temperature is measured) can be used as wire parameters. Furthermore, a wire parameter is not necessarily representative of any physical quantity (such as cross-sectional area or temperature) but can be a mere numerical parameter that allows determining (e.g. selecting) the desired characteristic used by the monitoring circuit. In one example, the wire parameter is merely a number indicating the characteristic curve to be applied. As shown in FIG. 7, the electronic fuse circuit may be an integrated circuit arranged in one chip package, wherein the electronic switch 2 and the remaining circuit components (driver 5, logic circuit 3 and monitoring circuit 4) may be integrated in the same semiconductor die or in two separate semiconductor dies disposed in the chip package. However, in other embodiments the smart fuse circuit 10 may be distributed in two or more separate chip packages. In the example of FIG. 7 all the depicted circuit components are integrated in one semiconductor chip.

The load current path of the electronic switch 2 may be connected between a supply pin SUP and an output pin OUT of the smart fuse circuit 10. Generally, the logic circuit 3 may be configured to receive at least one wire parameter, which in the present example includes information about a wire cross-sectional area A and a reference temperature difference $dT_R$, from a microcontroller or other control circuitry. As illustrated in FIG. 6, the logic circuit 3 may be configured to receive signals from a controller via input pin IN (input signal $S_{IN}$, see also FIG. 2) and input pins $SEL_{WIRE}$ and $SEL_{dT}$ (selection signals $S_{S1}$ and $S_{S2}$ representing a wire cross-sectional area and a temperature difference) and to provide a drive signal $S_{ON}$ for the electronic switch 2. The driver 5 may be configured to convert the signal $S_{ON}$, which is a binary logic signal, into a drive voltage or drive current suitable to switch the electronic switch 2 on and off. As in the example of FIG. 2, the monitoring circuit 4 receives an (analog) current sense signal CS and generates, based on this current sense signal CS, the first protection signal OC, which may be processed by the logic circuit 3, for example, as shown in the example of FIG. 3.

As mentioned, the filter 42 can be implemented as a first-order low-pass filter. That is, the (continuous-time) filter transfer function H(s) can be written as follows:

$$H(s) = \frac{b}{1+s\tau} \quad (1)$$

wherein $\tau$ represents the filter time constant and b represents the filter gain. The comparator 43 triggers a switch-off of the electronic switch 2 (by generating an over-current signal OC) when the following condition is fulfilled:

$$\mathcal{L}^{-1}\left\{P(s)\frac{b}{1+s\tau}\right\} \geq \Delta T. \quad (2)$$

Figure 10:
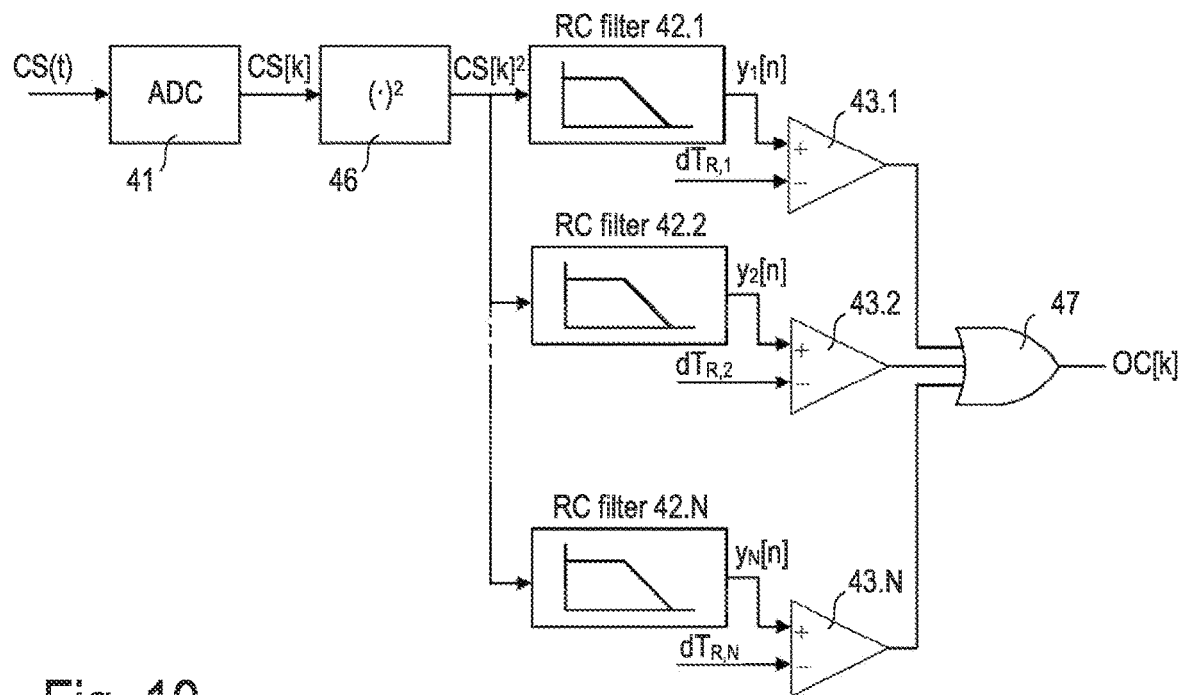
FIGS. 10 and 11 illustrates two alternative embodiments of a monitoring circuit, both of which use a plurality of filters and comparators with different filter time constants and, respectively, different comparator thresholds.

That is, a switch-off is triggered when the estimated cable temperature, which is represented by the filter output of the filter 42, reaches or exceeds a temperature threshold $\Delta T$ (in equation 2 $\mathcal{L}^{-1}\{\cdot\}$ denotes the inverse Laplace transform). The above condition (2) can be reformulated as $$\mathcal{L}^{-1}\left\{P(s)\frac{1}{1+s\tau}\right\} \geq dT_R, \quad (3)$$

wherein $dT_R = \Delta T/b$, and P(s) denotes the Laplace transform of the filter input signal. It is evident from conditions (2) and (3) that filter gain b and threshold value $\Delta T$ are not independent parameters. A specific reference temperature $dT_R$ can be achieved by different combinations of filter gain b and threshold value $\Delta T$ Varying the filter gain b has a similar effect as varying the temperature threshold $\Delta T$. It is understood that, although $dT_R$ represents a temperature, it is not measured in Kelvin (as can be seen in FIG. 10, $dT_R$ has the physical dimension of amperes squared).

Figure 8:
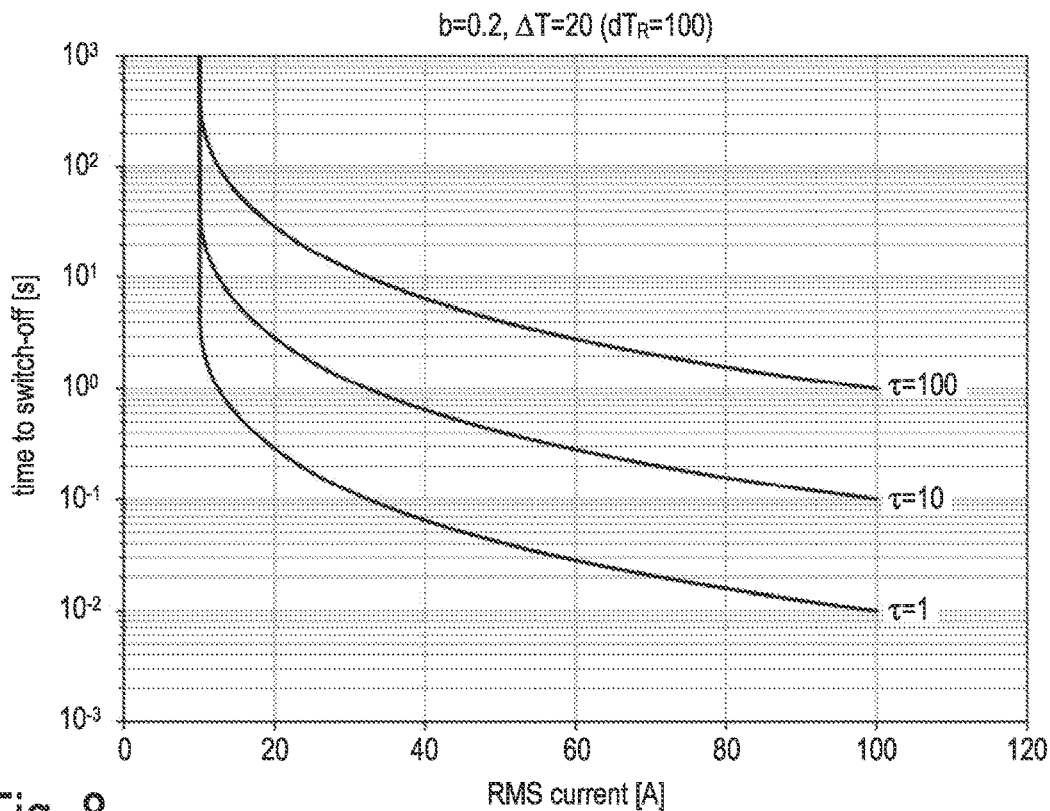
FIG. 8 is a diagram illustrating the effect of the filter time constant on the time-current characteristic in case a first order low-pass-filter is used in the monitoring circuit of FIG. 6.
Figure 9:
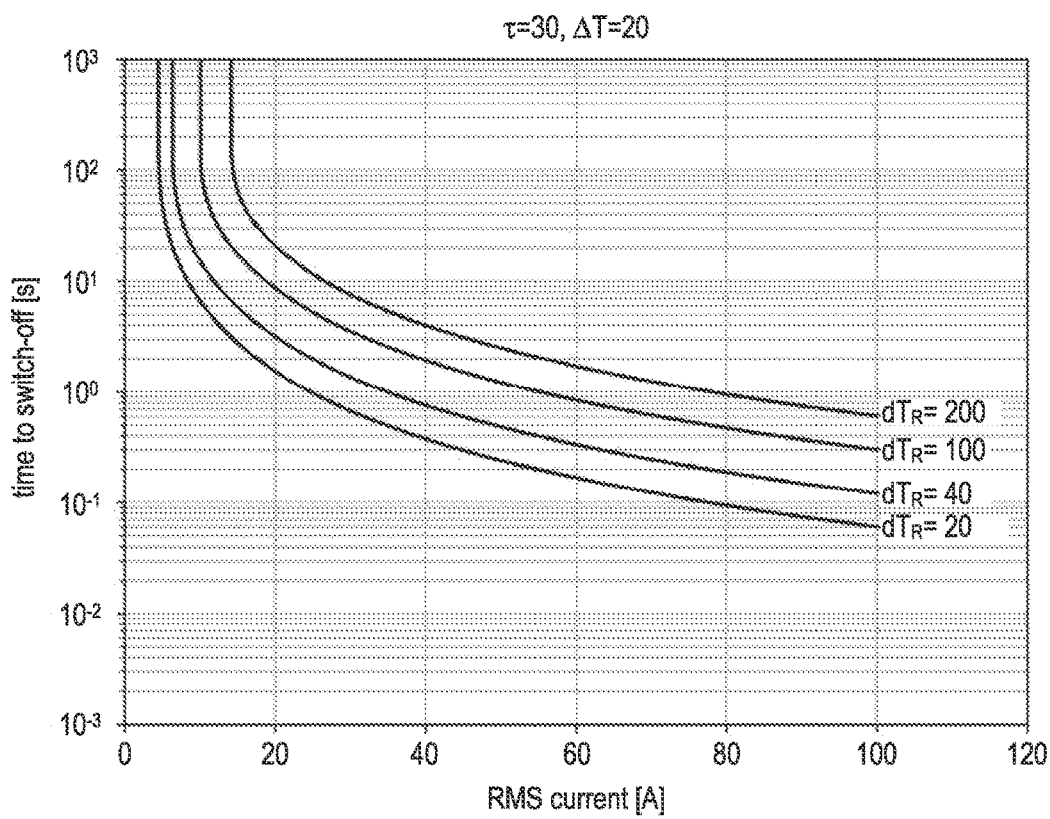
FIG. 9 is a diagram illustrating the effect of the comparator threshold on the time-current characteristic in a case in which a first order low-pass-filter is used in the monitoring circuit of FIG. 6.

FIGS. 8 and 9 illustrate the effect of varying the filter time constant $\tau$ and the filter gain b on the characteristic curve (cf. FIGS. 5A and 5B). As shown in FIG. 8, varying the filter time constant $\tau$ results in a vertical shift of the characteristic curve due to the scaling of the time axis. In contrast, as shown in FIG. 9, varying the filter gain b results in a horizontal shift of the characteristic curve due to the scaling of the current axis. It is noted that, in the example of FIG. 9, a filter gain b=1 results in a reference temperature $dT_R$ of $\Delta T/b=20$ degrees Celsius. Similarly, a filter gain b=0.5 results in a reference temperature $dT_R$ of $\Delta T/b=40$ degrees Celsius, a filter gain b=0.2 results in a reference temperature $dT_R$ of $\Delta T/b=100$ degrees Celsius, and a filter gain b=0.1 results in a reference temperature $dT_R$ of $\Delta T/b=200$ degrees Celsius.

It is again emphasized that instead of changing the filter gain b, the reference temperature $dT_R$ can be changed to achieve the same effect. In the further description, it is assumed (without loss of generality) that the filter gain b is constant and set to b=1, and the reference temperature $dT_R$ is adjustable to match the specification for a specific cable.

As mentioned, the filter output signal provided by the filter 42 and supplied to the comparator input of comparator 43 can be interpreted as a temperature. As can be seen from FIGS. 8 and 9, the options for selecting a specific time-current characteristic are very limited. Basically, the filter time constant $\tau$ and the comparator threshold $dT_R$ determine the characteristic curve, which can be shifted vertically and horizontally by varying the parameters $\tau$ and $dT_R$. However, by changing these two parameters it is not possible to change the shape of the time-current characteristic as such.

FIG. 10 illustrates a modified monitoring circuit 4 which allows to adapt the shape of the time-current characteristic in a flexible way and to customize it for a specific application. Like the example of FIG. 6, the embodiment of FIG. 8 includes an analog-to-digital converter 41 and a squaring unit 46. The analog-to-digital converter 41 receives the current sense signal CS(t) and provides the corresponding digitized signal CS[k] (k being the time index); the squaring unit 46 provides a signal representing the squared signal $CS[k]^2$. The squared signal $CS[k]^2$ is distributed to a plurality of signal paths, wherein each signal path includes a filter 42.n and a comparator 43.n (n=1, 2, ... N).

The output signals of the filters 42.1, 42.2, ..., 42.N are denoted as $y_1[k]$, $y_2[k]$, ..., $y_N[k]$; and the output signals of the comparators 43.1, 43.2, ..., 43.N are denoted as $OC_1$, $OC_2$, ..., $OC_N$. These over-current signals $OC_1$, $OC_2$, ..., $OC_N$ are supplied to a logic circuit 47, which may be an OR-gate with multiple inputs. The comparator thresholds are denoted as $dT_{R,1}$, $dT_{R,2}$, ..., $dT_{R,N}$. The output of the logic circuit 47 is denoted as OC[k] and signals a fault (which may trigger a switch-off of the electronic switch 2) when one of the over-current signals $OC_1$, $OC_2$, ..., $OC_N$ indicates a violation of the respective comparator threshold. In the example of FIG. 10, all filters 42.1, 42.2, ..., 42.N receive the squared current sense signal $CS[k]^2$, wherein only the output signal $y_1[k]$ is indicative of the physical quantity "cable temperature".

Figure 11:
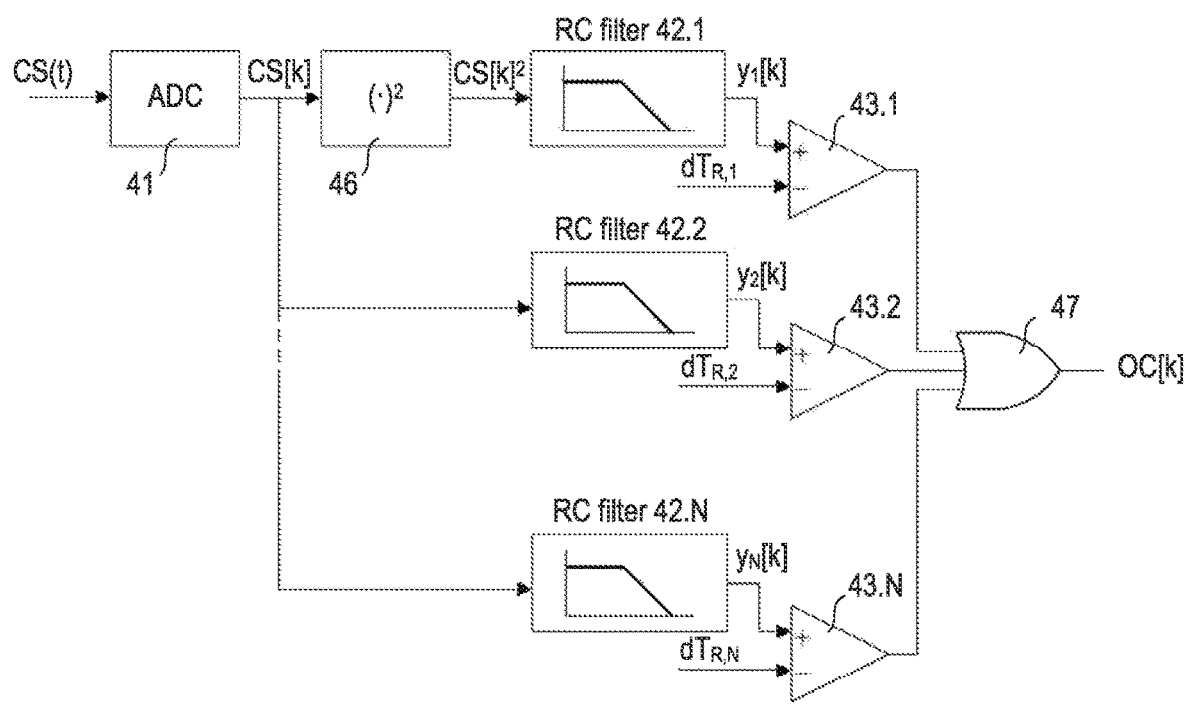
Figure 12:
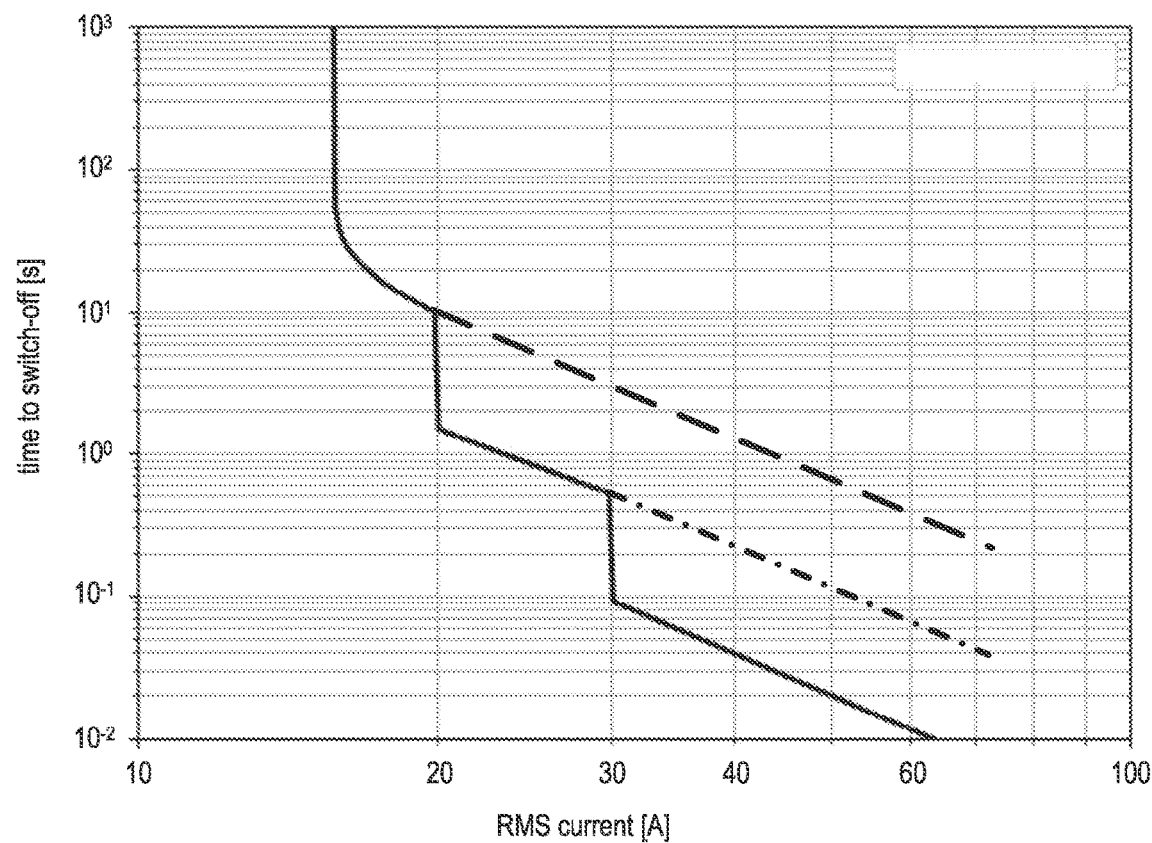
FIG. 12 illustrates one example of a complex time-current-characteristic that can be achieved with the embodiments of FIGS. 10 and 11.

The example of FIG. 11 is almost identical to the previous example of FIG. 10 except that only the first filter 42.1 receives the squared current sense signal $CS[k]^2$ whereas the other filters 42.2, ..., 42.N receive the (non-squared) current sense signal CS[k]. As mentioned, only the output signal $y_1[k]$ of the first filter 42.1 is indicative of the cable temperature whereas the remaining filters 2.2, ..., 42.N and corresponding comparator thresholds $dT_{R,2}$, ..., $dT_{R,N}$ are merely needed to adapt the time-current characteristic in a desired manner so that it meets the requirements of a specific application. One example is illustrates in FIG. 12. According to this, the resulting time-current characteristic is a concatenation of segments of the characteristic curves resulting from the N signal paths (for N=3 in the depicted example). Due to the OR-conjunction provided by the logic circuit 47, the resulting time-current characteristic is determined by the minimum of the characteristic curves of the N signal paths. That is, when one of the N signal paths signals an over-current switch-off (over-current signals $OC_1$, $OC_2$, ..., $OC_N$) then the signal OC will trigger a switch-off.

Figure 13:
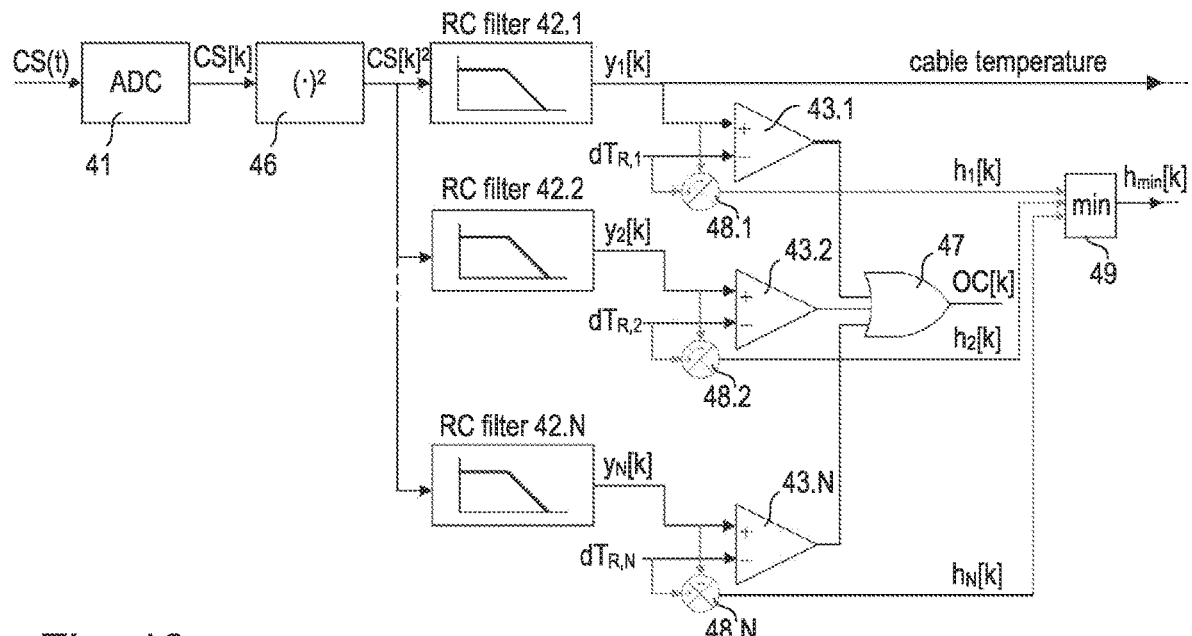
FIG. 13 illustrates another embodiment of a monitoring circuit.

FIG. 13 illustrates a further embodiment which can be seen as an enhancement of the example of FIG. 10. The circuit of FIG. 13 is basically the same as the circuit in FIG. 10 but with additional circuitry for determining the remaining minimum headroom before an overcurrent signal OC[k] (which usually triggers a switch-off) is generated. Accordingly, the circuit of FIG. 13 includes calculation circuits (e.g. subtractors) 43.1, 43.2, ..., 43.N configured to generate output signals $h_1[k]$, $h_2[k]$, ..., $h_N[k]$ representing the differences $y_1[k]-dT_{R,1}$, $y_2[k]-dT_{R,2}$, ..., $y_N[k]-dT_{R,N}$ "seen" by the comparators 43.1, 43.2, ..., 43.N. The selection circuit 49 is configured to provide, as output signal $h_{min}[k]$, the instantaneous minimum of the signals $h_1[k]$, $h_2[k]$, ..., $h_N[k]$, i.e. $h_{min}[k]=\min\{h_1[k], h_2[k], ..., h_N[k]\}$.

The signal $h_{min}[k]$ is representative of the available headroom before a failure is signaled (by setting the level of signal OC[k] to an appropriate value). As can be seen from FIG. 13, the circuit is capable of providing three types of information to be processed. One such information is the signal OC[k], which indicates an overcurrent and usually triggers a switch-off of the electronic switch 2 (cf. FIG. 2). Triggering a switch-off in response to the signal OC[k] is analogous to a conventional fuse being triggered in response to an overcurrent. Further information can be the headroom signal $h_{min}[k]$, which is indicative of how close the monitoring circuit is to generating a signal OC[k] indicating an overcurrent. Third, the cable temperature increase (temperature difference to ambient temperature) or the equivalent thermal status calculated by the filter 43.1 can also be provided.

The monitoring circuits of FIGS. 10, 11, and 13 may be integrated in one semiconductor chip package as discussed with reference to FIG. 7. An exemplary application is illustrated in FIG. 14, in which the integrated circuit, including electronic switch 2, monitoring circuit 4, and logic circuit 3 (see also FIGS. 2 and 7), is referred to as integrated smart fuse circuit 10. The input signal $S_{IN}$ is provided, in the present example, by a microcontroller 8. Further, the smart fuse circuit 10 is configured to provide the current sense signal CS(t) or any other signal representative of the load current passing through the electronic switch 2. This current sense signal CS(t) is received and digitized by the microcontroller 8.

With a circuit structure as shown in FIG. 14, it is possible to implement an additional filter (referred to as filter 42.N+1) in the microcontroller 8. Accordingly, the microcontroller 8 digitizes the current sense signal CS(t) and feeds the digitized signal CS[k] into a digital filter (e.g. a low-pass filter as discussed above with reference to FIG. 10). The filtered signal $y_{N+1}[k]$ is compared with a reference value $dT_{R,N+1}$ and the input signal $S_{IN}'$ is blanked if the filtered signal $y_{N+1}[k]$ reaches or exceeds the reference value $dT_{R,N+1}$. The modified (i.e. blanked, as the case may be) input signal is denoted as $S_{IN}'$ in FIG. 14. That is, due to the blanking of the input signal $S_{IN}$, the electronic switch 2 is switched off analogously as it would be in response to the signal OC[k] signaling an overcurrent. Accordingly, in this example, the logic circuit 3 (see FIGS. 2 and 7) is partly translocated into the microcontroller 8.

It is understood that the additional feedback loop implemented in the microcontroller 8 in the example of FIG. 14 may also be implemented by other external circuitry (i.e. outside the smart fuse circuit 10) other than the microcontroller.

The following numbered clauses demonstrate one or more aspects of the disclosure.

Clause 1—A circuit comprising: a monitor circuit (4) configured to receive a current sense signal (CS[k]) and to provide a protection signal (OC), wherein the monitor circuit (4) comprises: a nonlinear functional unit configured to receive the current sense signal (CS[k]) and to generate a power signal ($CS[k]^2$) representing the power of the current sense signal; a first filter configured to receive the power signal ($CS[k]^2$) and to generate a first filtered signal ($y_1[k]$), and a second filter configured to receive an input signal that depends on the current sense signal (CS[k]) and to generate a second filtered signal ($y_2[k]$); and a comparator circuit configured to receive the first filtered signal ($y_1[k]$) and the second filtered signal ($y_2[k]$) and to compare the first filtered signal ($y_1[k]$) with a first threshold value ($\Delta T_1$) and the second filtered signal ($y_2[k]$) with a second threshold value ($\Delta T_2$); the protection signal being indicative of whether the first filtered signal ($y_1[k]$) exceeds the first threshold value ($\Delta T_1$) or the second filtered signal ($y_2[k]$) exceeds the second threshold value ($\Delta T_2$).

Clause 2—The circuit of clause 1, further comprising: an electronic switch (2) coupled between a supply pin (SUP) and an output pin (OUT); and a current sensing circuit coupled to the electronic switch (2) and configured to generate the current sense signal (CS[k]) indicative of a load current ($i_L$) passing through the electronic switch (2).

Clause 3—The circuit of clause 1 or 2, wherein the first filter is a low-pass filter.

Clause 4—The circuit of any of clauses 1 to 3, wherein the first filter is a first order low-pass filter.

Clause 5—The circuit of any of clauses 1 to 4, wherein the input signal of the second filter is the power signal ($CS[k]^2$).

Clause 6—The circuit of any of clauses 1 to 4, wherein the input signal of the second filter is the current sense signal (CS[k]).

Clause 7—The circuit of any of clauses 1 to 6, wherein the current sensing circuit includes an analog-to-digital converter configured to provide the current sense signal (CS[k]) in digital form; and wherein the nonlinear functional unit is implemented in the analog-to-digital converter by using a non-linear analog-to-digital conversion characteristics.

Clause 8—The circuit of any of clauses 1 to 7, wherein the nonlinear functional unit is configured to perform a digital squaring of the current sense signal (CS[k]).

Clause 9.—The circuit of any of clauses 1 to 7, wherein the nonlinear functional unit is configured to generate the power signal ($CS[k]^2$) as a signal proportional to the square of the load current ($i_L$).

Clause 10—The circuit of any of clauses 2 to 9, if referring to claim 2, wherein the first filtered signal ($y_1[k]$) represents a temperature difference of a cable connected to the electronic switch relative to ambient temperature.

Clause 11—The circuit of any of clauses 1 to 10, wherein the monitor circuit (4) is further configured to generate a headroom signal (h[k]) based on the differences between the filtered signals ($y_1[k], y_2[Mk], \ldots, y_N[k]$) supplied to the comparator circuit and the respective threshold values ($dT_{R1}, dT_{R2}, \ldots, dT_{RN}$).

Clause 12—The circuit of any of clauses 1 to 11, if referring to claim 2, further comprising: a logic circuit (3) configured to trigger a switch-off of the electronic switch (2) or signal an error in response to the protection signal (OC).

Clause 13—The circuit of clause 12, wherein the logic circuit (3) is configured to receive a switch-on command and to trigger a switch-on of the electronic switch (2) in response to the switch-on command.

Clause 14—The circuit of any of clauses 1 to 13, if referring to claim 2, wherein the current sensing circuit, the nonlinear functional unit, and the first filter are integrated in a single semiconductor chip, the semiconductor chip has an output contact configured to provide a signal representing the current sense signal (CS(t)), and wherein the second filter is implemented using external circuitry connected to the semiconductor chip.

Clause 15—The circuit of any of clauses 1 to 14, further comprising: at least a third filter configured to receive the input signal that depends on the current sense signal (CS[k]) and to generate a third filtered signal ($y_3[k]$), wherein the comparator circuit is further configured to receive the third filtered signal ($y_3[k]$) and to compare it with a third threshold value ($\Delta T_3$); the protection signal being indicative of whether one of the filtered signals ($y_1[k], y_2[k], y_N[k]$) exceeds the respective threshold value ($\Delta T_1, \Delta T_2, \ldots \Delta T_N$).

Clause 16—A method comprising: providing a signal representing a load current ($i_L$) passing through a power transistor (2); and generating a protection signal (OC) based on the current sense signal (CS); wherein generating the protection signal (OC) includes: generating a power signal (CS[k]$^2$) representing the power of the current sense signal by applying a nonlinear function to the current sense signal (CS); filtering the power signal (CS[k]$^2$) to generate a first filtered signal ($y_1[k]$) and generating a second filtered signal ($y_2[k]$) based on the current sense signal (CS); and comparing the first filtered signal ($y_1[k]$) with a first threshold value ($dT_{R1}$) and the second filtered signal ($y_2[k]$) with a second threshold value ($dT_{R2}$); the protection signal (OC[k]) being indicative of whether the first filtered signal ($y_1[k]$) exceeds the first threshold value ($\Delta T_1$) or the second filtered signal ($y_2[k]$) exceeds the second threshold value ($\Delta T_2$).

Clause 17—The method of clause 16, further comprising: disconnecting an output pin (OUT) from a supply pin (SUP) using the power transistor based on the protection signal (OC[k]).

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. A circuit comprising:
a monitor circuit configured to receive a current sense signal and to provide a protection signal, wherein the monitor circuit comprises:
a nonlinear functional unit configured to receive the current sense signal and to generate a power signal representing the power of the current sense signal;
a first filter configured to receive the power signal and to generate a first filtered signal;
a second filter configured to receive an input signal that depends on the current sense signal and to generate a second filtered signal;
a third filter configured to receive the input signal that depends on the current sense signal and to generate a third filtered signal; and
a comparator circuit configured to receive the first filtered signal and the second filtered signal and the third filtered signal and to compare the first filtered signal with a first threshold value and to compare the second filtered signal with a second threshold value and to compare the third filtered signal with a third threshold value; the protection signal being indicative of whether the first filtered signal exceeds the first threshold value or the second filtered signal exceeds the second threshold value or the third filtered signal exceeds the third threshold value.

2. The circuit of claim 1, further comprising:
an electronic switch coupled between a supply pin and an output pin; and
a current sensing circuit coupled to the electronic switch and configured to generate the current sense signal indicative of a load current passing through the electronic switch.

3. The circuit of claim 2,
wherein the first filtered signal represents a temperature difference of a cable connected to the electronic switch relative to ambient temperature.

4. The circuit of claim 2, further comprising:
a logic circuit configured to trigger a switch-off of the electronic switch or signal an error in response to the protection signal.

5. The circuit of claim 4,
wherein the logic circuit is configured to receive a switch-on command and to trigger a switch-on of the electronic switch in response to the switch-on command.

6. The circuit of claim 2,
wherein the current sensing circuit, the nonlinear functional unit, and the first filter are integrated in a single semiconductor chip, the semiconductor chip has an output contact configured to provide a signal representing the current sense signal, and
wherein the second filter is implemented using external circuitry connected to the semiconductor chip.

7. The circuit of claim 1,
wherein the first filter is a low-pass filter.

8. The circuit of claim 1,
wherein the first filter is a first order low-pass filter.

9. The circuit of claim 1,
wherein the input signal of the second filter is the power signal.

10. The circuit of claim 1,
wherein the input signal of the second filter is the current sense signal.

11. The circuit of claim 1,
wherein the current sensing circuit includes an analog-to-digital converter configured to provide the current sense signal in digital form; and
wherein the nonlinear functional unit is implemented in the analog-to-digital converter by using a non-linear analog-to-digital conversion characteristics.

12. The circuit of claim 1,
wherein the nonlinear functional unit is configured to perform a digital squaring of the current sense signal.

13. The circuit of claim 1,
wherein the nonlinear functional unit is configured to generate the power signal as a signal proportional to the square of the load current.

14. The circuit of claim 1,
wherein the monitor circuit is further configured to generate a headroom signal based on the differences between the filtered signals supplied to the comparator circuit and the respective threshold values.

15. A method comprising:
providing a signal representing a load current passing through a power transistor; and
generating a protection signal based on the current sense signal;
wherein generating the protection signal includes:
generating a power signal representing the power of the current sense signal by applying a nonlinear function to the current sense signal;
filtering the power signal to generate a first filtered signal and generating a second filtered signal based on the current sense signal;
generating a third filtered signal using a third filter to filter the current sensed signal; and comparing the first filtered signal with a first threshold value, comparing the second filtered signal with a second threshold value, and comparing the third filtered signal with a third threshold value; the protection signal being indicative of whether the first filtered signal exceeds the first threshold value or the second filtered signal exceeds the second threshold value or the third filtered signal exceeds the third threshold value.

16. The method of claim 15, further comprising:

disconnecting an output pin from a supply pin using the power transistor based on the protection signal.

* * * * *